(12) United States Patent
Li et al.

(10) Patent No.: US 12,256,568 B2
(45) Date of Patent: Mar. 18, 2025

(54) SEMICONDUCTOR STRUCTURE HAVING TWO N-TYPE DEVICES AND TWO P-TYPE DEVICES AND MANUFACTURING METHOD THEREOF

(71) Applicant: CHANGXIN MEMORY TECHNOLOGIES, INC., Hefei (CN)

(72) Inventors: Xiaojie Li, Hefei (CN); Mengmeng Yang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 474 days.

(21) Appl. No.: 17/657,875

(22) Filed: Apr. 4, 2022

(65) Prior Publication Data

US 2023/0057058 A1 Feb. 23, 2023

(30) Foreign Application Priority Data

Aug. 20, 2021 (CN) .......................... 202110963282.5

(51) Int. Cl.
*H10D 84/03* (2025.01)
*H01L 21/28* (2025.01)
(Continued)

(52) U.S. Cl.
CPC ..... *H10D 84/038* (2025.01); *H01L 21/28088* (2013.01); *H01L 21/32134* (2013.01); *H01L 21/32135* (2013.01); *H01L 21/32139* (2013.01); *H10D 30/751* (2025.01); *H10D 64/667* (2025.01); *H10D 84/0167* (2025.01); *H10D 84/0177* (2025.01); *H10D 84/856* (2025.01)

(58) Field of Classification Search
CPC ....... H01L 21/823842; H01L 21/28088; H01L 27/0922; H10D 84/0177; H10D 84/8311; H10D 84/856; H10D 84/83138; H10D 84/8314
See application file for complete search history.

(56) References Cited

U.S. PATENT DOCUMENTS

2011/0217824 A1* 9/2011 Ohuchi ................... H01L 21/02
257/E21.004
2013/0020657 A1* 1/2013 Lu ..................... H01L 29/66545
257/411
(Continued)

FOREIGN PATENT DOCUMENTS

CN 108257918 A 7/2018
CN 109545749 A 3/2019

*Primary Examiner* — Kevin Parendo
(74) *Attorney, Agent, or Firm* — Syncoda LLC; Feng Ma

(57) ABSTRACT

A manufacturing method of a semiconductor structure includes the following operations. A substrate is provided, which includes a first N region, a first P region, a second N region and a second P region adjacently arranged in sequence. A gate dielectric layer, a first barrier layer, a first work function layer and a second barrier layer are formed on the substrate in sequence. A mask layer is formed on the second barrier layer of the first P region and the second P region. The second barrier layer of the first N region and the second N region is removed by a first etching process with the mask layer as a mask. The first work function layer and the first barrier layer of the first N region and the second N region are removed by a second etching process. A semiconductor structure is also provided.

13 Claims, 8 Drawing Sheets

(51) Int. Cl.
    *H01L 21/3213*     (2006.01)
    *H10D 30/69*     (2025.01)
    *H10D 64/66*     (2025.01)
    *H10D 84/01*     (2025.01)
    *H10D 84/85*     (2025.01)

(56) References Cited

U.S. PATENT DOCUMENTS

| | | | | |
|---|---|---|---|---|
| 2013/0203231 | A1* | 8/2013 | Fitzsimmons | C23F 1/40 |
| | | | | 438/585 |
| 2014/0246729 | A1* | 9/2014 | Jang | H01L 21/823864 |
| | | | | 257/377 |
| 2015/0126023 | A1* | 5/2015 | Choi | H01L 29/512 |
| | | | | 438/591 |
| 2018/0240753 | A1* | 8/2018 | LaRoche | H01L 21/28575 |
| 2020/0006356 | A1* | 1/2020 | Ando | H01L 21/02532 |

\* cited by examiner

SEMICONDUCTOR STRUCTURE HAVING TWO N-TYPE DEVICES AND TWO P-TYPE DEVICES AND MANUFACTURING METHOD THEREOF

CROSS-REFERENCE TO RELATED APPLICATION

The present application claims priority to Chinese Patent Application No. 202110963282.5 filed on Aug. 20, 2021, the disclosure of which is hereby incorporated by reference in its entirety.

BACKGROUND

The main semiconductor devices of integrated circuits, especially those of super-large-scale integrated circuits, are metal-oxide-semiconductor field effect transistors (MOS transistors for short). With the continuous development of integrated circuit manufacturing technology, the technical nodes of semiconductor devices are decreasing continuously, and the gate length of transistors is decreasing continuously, so that the thickness of gate dielectric layers is also reduced to improve the short channel effect. A material of a gate dielectric layer may be silicon dioxide, and when the thickness is small to a certain extent, there is apparent tunneling leakage.

SUMMARY

The disclosure relates to the technical field of semiconductors, and in particular to a semiconductor structure and a manufacturing method thereof.

In a first aspect, an embodiment of the present disclosure provides a manufacturing method of a semiconductor structure. The manufacturing method includes: providing a substrate, in which the substrate comprises a first N region of a first N-type device, a first P region of a first P-type device, a second N region of a second N-type device and a second P region of a second P-type device, in which the first P region is adjacent to the first N region and the second N region, and the second N region is adjacent to the first P region and the second P region; forming a gate dielectric layer, a first barrier layer on the gate dielectric layer, a first work function layer on the first barrier layer and a second barrier layer on the first work function layer on the substrate in sequence; forming a mask layer on the second barrier layer of the first P region and the second P region; removing the second barrier layer of the first N region and the second N region by a first etching process with the mask layer as a mask, so as to expose the first work function layer of the first N region and the second N region; removing the first work function layer and the first barrier layer of the first N region and the second N region by a second etching process, so as to expose the gate dielectric layer of the first N region and the second N region.

In a second aspect, an embodiment of this disclosure provides a semiconductor structure formed by the manufacturing method of the semiconductor structure of the first aspect. The semiconductor structure comprises a substrate and a gate dielectric layer on the substrate. The substrate comprises a first N region of a first N-type device, a first P region of a first P-type device, a second N region of a second N-type device and a second P region of a second P-type device. The first P region is adjacent to the first N region and the second N region, and the second N region is adjacent to the first P region and the second P region. A first barrier layer, a first work function layer and a second barrier layer are stacked in sequence on the gate dielectric layer of the first P region and the second P region.

BRIEF DESCRIPTION OF THE DRAWINGS

In order to more clearly illustrate the technical solutions of the embodiments of this disclosure, the drawings used in the description of the embodiments will be briefly introduced hereinbelow. Apparently, the drawings in the following description are some embodiments of this disclosure, and for an ordinary person skilled in the art, other drawings can be obtained according to these drawings without making creative efforts.

DETAILED DESCRIPTION

Figure 1:
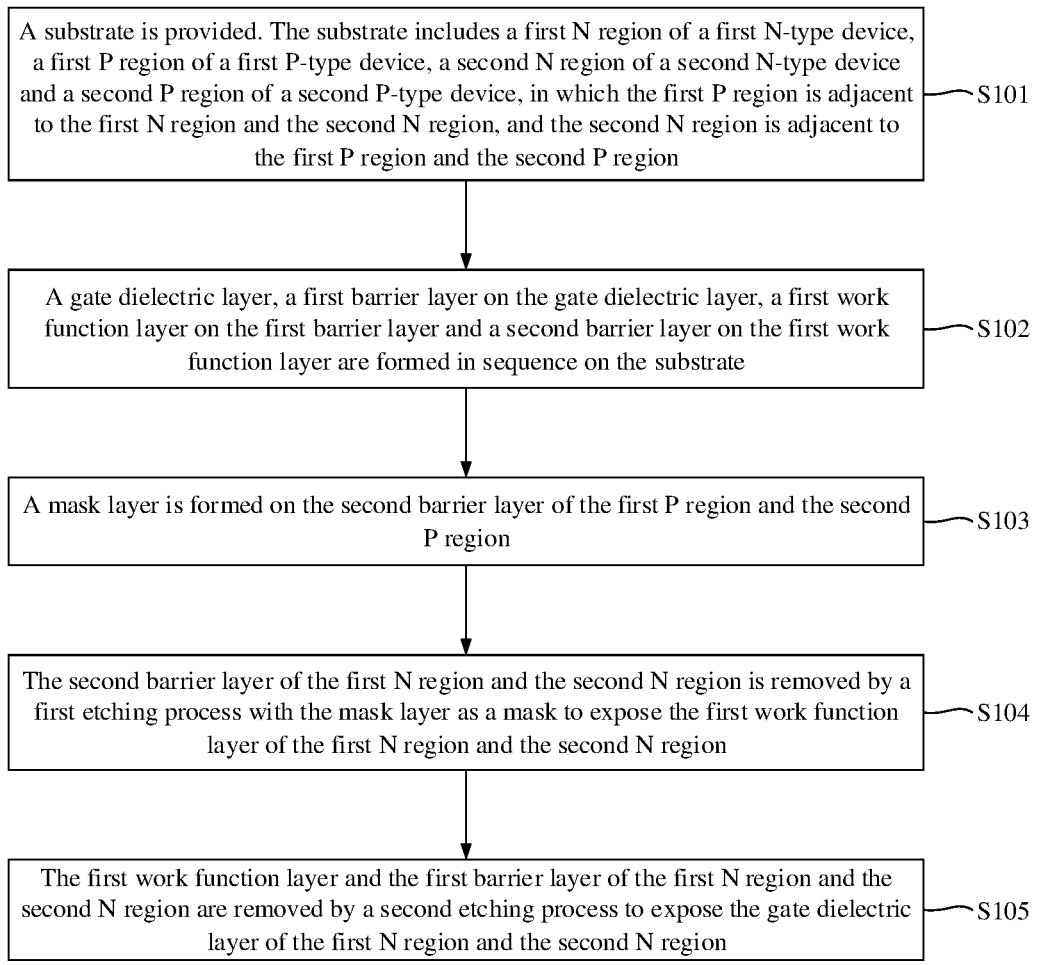
FIG. 1 is a schematic flowchart of a manufacturing method of a semiconductor structure provided by an embodiment of this disclosure.

In some implementations, a high dielectric constant (high-K) gate dielectric material is used to replace the silicon dioxide gate dielectric material, and metal is used as the gate electrode to avoid boron penetration effect and Fermi level pinning effect between the high-K material and the gate electrode material, thereby reducing leakage current of semiconductor structures.

However, the reliability of the electrical properties of the semiconductor structures formed in some implementations is poor.

In some implementations, a substrate includes a first N region, a first P region, a second N region and a second P region which are adjacently arranged in sequence. A gate dielectric layer, a first barrier layer, a first work function layer and a second barrier layer are stacked in sequence on the substrate. In order to remove the second barrier layer, the first work function layer and the first barrier layer corresponding to the first N region and the second N region, a mask layer is formed on the second barrier layer corresponding to the first P region and the second P region. With the mask layer as a mask, the second barrier layer, the first work function layer and the first barrier layer in the first N region and the second N region are removed by a wet etching process, so as to expose the gate dielectric layer. However, in some implementations, because there are many layers to be etched and removed in the wet etching process, the etching time required is relatively long. The second barrier layer, the first work function layer and the first barrier layer at the respective intersection positions of the first P region and the second P region with the first N region and the second N region are exposed in the wet etching environment one after another, causing a lateral etching to the second barrier layer, the first work function layer and the second barrier layer at the intersection positions. As a result, the edge profile of the semiconductor structure of the first P region and the second P region is over-etched with respect to the surface of the substrate, thereby resulting in the technical problem that the reliability of the electrical properties of semiconductor structures is poor.

In view of this, the embodiments of this disclosure provide a semiconductor structure and a manufacturing method of the semiconductor structure. In the manufacturing method of the semiconductor structure, the second barrier layer of the first N region and the second N region is removed by a first etching process, so as to expose the first work function layer of the first N region and the second N region. The first work function layer and the first barrier layer of the first N region and the second N region are removed by a second etching process, so as to expose the gate dielectric layer of the first N region and the second N region. In this way, the relatively long process time required in one single etching process can be avoided, and the problem of over-etching of the sidewall profiles of the first P region and the second P region can be solved, thereby improving the reliability of the electrical properties of semiconductor structures.

In order to make the above-mentioned objectives, features and advantages of the embodiments of this disclosure more apparent and easy to be understood, the technical solutions in the embodiments of this disclosure will be clearly and completely described with reference to the drawings in the embodiments of this disclosure. Apparently, the described embodiments are only a part of the embodiments of this disclosure, not all of them. Based on the embodiments in this disclosure, any other embodiments obtained by an ordinary person skilled in the art without making creative efforts are within the scope of protection of this disclosure.

FIG. 1 is a schematic flowchart of a manufacturing method of a semiconductor structure provided by an embodiment of this disclosure. FIG. 2 to FIG. 8 are cross-sectional structural views showing a formation process of a semiconductor structure provided by an embodiment of this disclosure.

As shown in FIG. 1, the manufacturing method of the semiconductor structure provided by the embodiment of this disclosure includes S101, S102, S103, S104 and S105.

At S101, a substrate is provided. The substrate includes a first N region of a first N-type device, a first P region of a first P-type device, a second N region of a second N-type device and a second P region of a second P-type device, the first P region is adjacent to the first N region and the second N region, and the second N region is adjacent to the first P region and the second P region.

The substrate 100 may be made of a crystalline semiconductor material, for example, a silicon (Si) substrate. The substrate 100 may also be a germanium (Ge) substrate, a silicon germanium (SiGe) substrate, a silicon carbide (SiC) substrate or a gallium nitride (GaN) substrate, etc. In this regard, the embodiments of this disclosure are not intended to make particular limitations.

It can be understood that the substrate 100 includes the first N region 101 and the second N region 103, the first N region 101 is a region used for forming the first N-type device and the second N region 103 is a region used for forming the second N-type device. The substrate 100 also includes the first P region 102 and the second P region 104, the first P region 102 is a region used for forming the first P-type device and the second P region 104 is a region used for forming the second P-type device.

Exemplarily, the first N-type device may be a first NMOS transistor, the second N-type device may be a second NMOS transistor, the first P-type device may be a first PMOS transistor, and the second P-type device may be a second PMOS transistor.

The first N region 101, the first P region 102, the second N region 103 and the second P region 104 are isolated by an isolation structure therebetween. The isolation structure may be a shallow trench isolation structure, which includes a shallow trench in the substrate 100 and an insulating material, such as silicon oxide or the like, that is filled in the shallow trench.

At S102, a gate dielectric layer, a first barrier layer on the gate dielectric layer, a first work function layer on the first barrier layer and a second barrier layer on the first work function layer are formed on the substrate in sequence.

Figure 2:
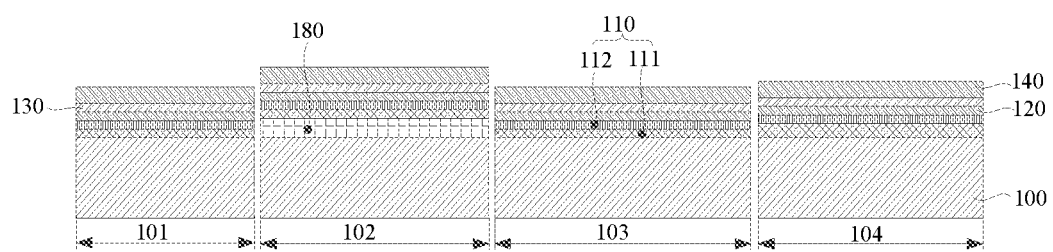
FIG. 2 is a first cross-sectional structural view showing a formation process of a semiconductor structure provided in an embodiment of this disclosure.

As shown in FIG. 2, the gate dielectric layer 110, the first barrier layer 120 on the gate dielectric layer 110, the first work function layer 130 on the first barrier layer 120 and the second barrier layer 140 on the first work function layer 130 are formed on the substrate 100.

The gate dielectric layer 110 may be made of a gate dielectric material with a high dielectric constant (high-K) to maintain a certain physical thickness and excellent leakage performance, so as to adapt to integrated circuits with a nanometer line width and maintain a good interface and high thermal stability with a silicon substrate.

Exemplarily, the material of high-K gate dielectric layers 112 includes at least one of aluminum trioxide, tantalum pentoxide, yttrium oxide, hafnium silicon oxide, hafnium dioxide, lanthanum oxide, zirconium dioxide, strontium titanate, zirconium silicon oxide compound and other materials with a high dielectric constant.

In addition, the material of the first barrier layer 120 may include titanium nitride (TiN), and the material of the first work function layer 130 may include aluminum oxide (AlO). The material of the second barrier layer 140 may also include titanium nitride (TiN).

The first work function layer 130 may be formed by a chemical vapor deposition process, a physical vapor deposition process or an atomic layer deposition process.

At S103, a mask layer is formed on the second barrier layer of the first P region and the second P region.

Figure 3:
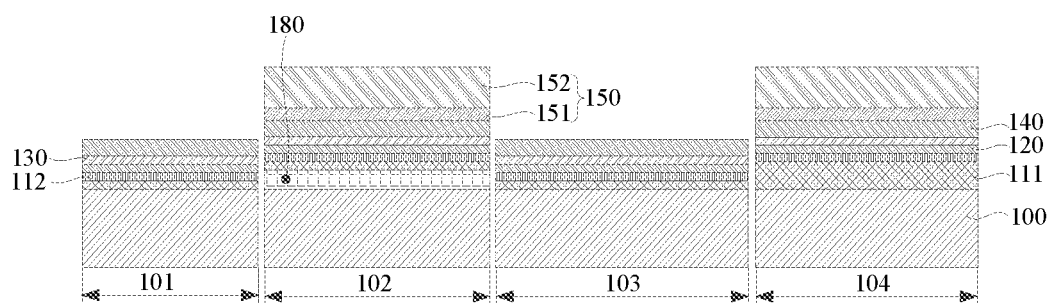
FIG. 3 is a second cross-sectional structural view showing a formation process of a semiconductor structure provided in an embodiment of this disclosure.

As shown in FIG. 3, the mask layer 150 is formed on the second barrier layer 140 of the first P region 102 and the second P region 104 by a spin coating process or the like.

It can be understood that an initial mask layer is formed on the second barrier layer of the first N region 101, the first P region 102, the second N region 103 and the second P region 104. Then, the initial mask layer is patterned by exposure and development, and the initial mask layer of the first N region 101 and the second N region 103 is removed, and the initial mask layer on the second barrier layer of the first P region and the second P region is retained to form the mask layer 150.

At S104, the second barrier layer of the first N region and the second N region is removed by the first etching process with the mask layer as a mask, so as to expose the first work function layer of the first N region and the second N region.

The first etching process may be a dry etching process, and an etching gas for the dry etching may be chlorine, etc.

Figure 4:
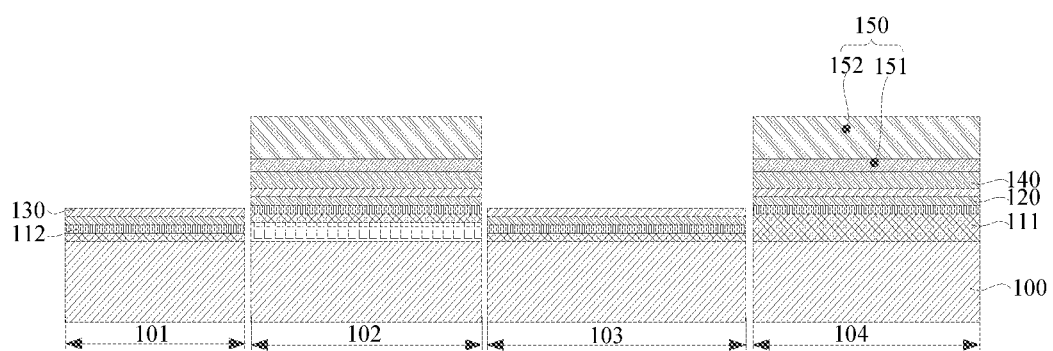
FIG. 4 is a third cross-sectional structural view showing a formation process of a semiconductor structure provided in an embodiment of this disclosure.

As shown in FIG. 4, using the mask layer 150 as the mask, the second barrier layer 140 of the first N region 101 and the second N region 103 is removed by the dry etching process, so as to expose the first work function layer 130 of the first N region 101 and the second N region 103.

It can be understood that in this embodiment, the etching gas for the dry etching process is chlorine. In this way, during the etching process, the first work function layer 130 functions as an etch stop layer, and chlorine does not etch the first work function layer 130. Moreover, the dry etching process being used is an anisotropic etching, thus ensuring the integrity of the profiles at the respective intersection positions of the first P region 102 and the second P region 104 with the first N region 101 and the second N region 103, thereby improving the reliability of the electrical properties of semiconductor structures.

At S105, the first work function layer and the first barrier layer of the first N region and the second N region are removed by the second etching process, so as to expose the gate dielectric layer of the first N region and the second N region.

It can be understood that the second etching process may be a wet etching process.

Figure 5:
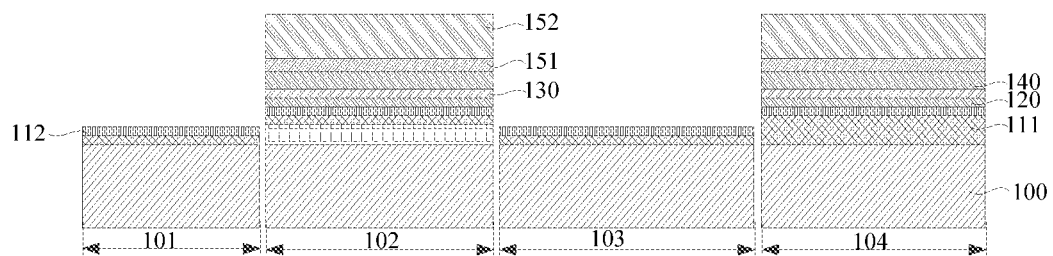
FIG. 5 is a fourth cross-sectional structural view showing a formation process of a semiconductor structure provided in an embodiment of this disclosure.

As shown in FIG. 5, the first work function layer 130 and first barrier layer 120 of the first N region 101 and the second N region 103 are etched by the wet etching process, so as to expose the gate dielectric layer 110 of the first N region 101 and the second N region 103, retaining the first work function layer 130 of the first P region 102 and the second P region 104. As a part of the corresponding work function layer of the first P-type device and the second P-type device, the first work function layer 130 is used to adjust the threshold voltages of the first P-type device and the second P-type device.

In the embodiment of the disclosure, the second barrier layer 140 of the first N region 101 and the second N region 103 is removed by the first etching process, so as to expose the first work function layer 130 of the first N region 101 and the second N region 103. The first work function layer 130 and first barrier layer 120 of the first N region 101 and the second N region 103 are removed by the second etching process, so as to expose the gate dielectric layer 110 of the first N region 101 and the second N region 103. In this way, the problem that the process time of one single etching process is relatively long can be avoided, so that the problem that the sidewall profiles of the first P region 102 and the second P region 104 are over-etched is solved, thereby improving the reliability of the electrical properties of semiconductor structures.

It can be understood that, when the dry etching process is used as the first etching process and the wet etching process is used as the second etching process, the number of layers to be etched by the wet etching process can be reduced, and the etching time required by the wet etching process can be shortened. As a result, the time, that the second barrier layer 140, the first work function layer 130 and the first barrier layer 120 at the respective intersection positions of the first P region 102 and the second P region 104 with the first N region 101 and the second N region 103 are exposed to the wet etching environment one after another, is shortened. In turn, the phenomenon of lateral etching of the second barrier layer 140, the first work function layer 130 and the first barrier layer 120 at the intersection positions of the first P region 102 and of the second P region 104 can be alleviated.

As an optional embodiment, the etching rate of the etching gas for the dry etching process to the second barrier layer 140 is greater than that of the etching gas to the first work function layer 130. In this case, when the second barrier layer 140 is etched, the first work function layer 130 functions as an etch stop layer, avoiding the etching of the first work function layer 130.

Exemplarily, the etching rate of the etching gas (for example, the etching gas is chlorine) to the first work function layer 130 may be zero, so as to avoid etching the first work function layer 130 when the second barrier layer 140 is etched.

When the etching gas for the dry etching is chlorine, the flow rate of the etching gas is 25-50 sccm in the etching process. For example, the flow rate of the etching gas may be 35 sccm in the etching process.

It can be understood that the etching rate of the dry etching process can be controlled by controlling the flow rate of etching gas per minute.

As an optional embodiment, an etching solution for etching the first work function layer 130 and first barrier layer 120 of the first N region 101 and the second N region 103 by the wet etching process may be a SC1 solution. The SC1 solution may be a mixed aqueous solution of aqua ammonia, hydrogen peroxide and water, in which the volume fraction ratio of aqua ammonia, hydrogen peroxide and water may be 1:1.5:10-1:3:100.

In addition, the process parameters of the wet etching process include an etching temperature of 32° C.-58° C. and an etching time of 65 s-185 s.

By setting the etching temperature to 32° C.-58° C., a low etching rate caused by an excessively low temperature of the etching solution is avoided, and an excessively fast lateral etching rate to the second barrier layer 140, the first work function layer 130 and the first barrier layer 120 at the intersection positions of the first P region 102 and of the second P region 104, which is caused by an excessively high temperature of the etching solution, is avoided, preventing the second barrier layer 140, the first work function layer 130 and the first barrier layer 120 at the intersection positions of the first P region 102 and of the second P region 104 from suffering a serious etching damage.

On the basis of the above embodiments, before the gate dielectric layer 110, the first barrier layer 120 on the gate dielectric layer 110, the first work function layer 130 on the first barrier layer 120 and the second barrier layer 140 on the first work function layer 130 are formed on the substrate 100 in sequence, the manufacturing method further includes forming a strain layer 180 on the substrate 100 of the first P region 102. The material of the first strain layer 180 includes silicon germanium.

Furthermore, after forming the strain layer 180 on the substrate 100 of the first P region 102, the manufacturing method further includes: forming an interface layer 111 on the substrate 100 of the first N region 101, the second N region 103, the second P region 104 and on the strain layer 180 of the first P region 102.

The interface layer 111 plays a transitional and blocking role, preventing the high-K gate dielectric layer 112 from reacting with the material of the substrate 100 and preventing the first work function layer 130 from diffusion. The material of the interface layer 111 includes one of silicon oxide and silicon oxynitride. The interface layer 111 may be formed by oxidizing the surface of the substrate 100 by a thermal oxidation or in-situ water vapor generation process.

The high-K gate dielectric layer 112 is formed on the interface layer 111. The interface layer 111 and the high-K gate dielectric layer 112 together form a gate dielectric layer 110. The high-K gate dielectric layer 112 has a dielectric constant greater than that of silicon dioxide ($SiO_2$).

The thickness of the interface layer 111 of the second N region 103 is greater than that of the interface layer 111 of the first N region 101, and the thickness of the interface layer 111 of the second P region 104 is greater than that of the interface layer 111 of the first P region 102, which can alleviate the problem of tunneling leakage.

Forming the mask layer 150 on the second barrier layer 140 of the first P region 102 and the second P region 104 specifically includes forming an anti-reflection layer 151 on the second barrier layer 140, and forming a photoresist layer 152 on the anti-reflection layer 151. The anti-reflection layer 151 may include at least one layer of organic anti-reflection substance or inorganic anti-reflection substance, so as to increase the window of a lithography process and improve the strip width control of lithography.

The anti-reflection layer 151 and the photoresist layer 152 together form the mask layer 150.

Figure 6:
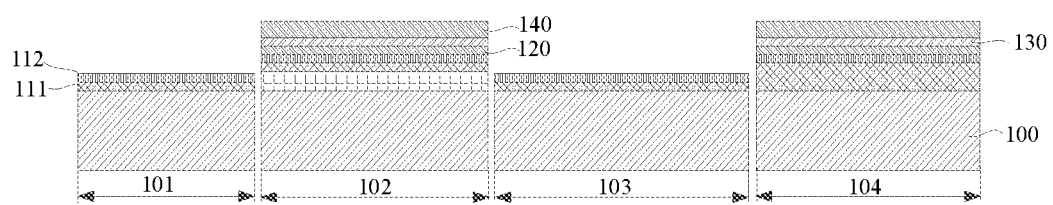
FIG. 6 is a fifth cross-sectional structural view showing a formation process of a semiconductor structure provided in an embodiment of this disclosure.

As shown in FIG. 6, the mask layer 150 of the first N region 101 and the second N region 103 is removed, and the mask layer 150 of the first P region 102 and the second P region 104 is retained. Thus, the mask layer 150 is patterned. The second barrier layer 140 of the first N region 101 and the second N region 103 is etched by using the patterned mask layer 150 as a mask.

The first work function layer 130 and the first barrier layer 120 of the first N region 101 and the second N region 103 are removed by the second etching process, so as to expose the gate dielectric layer 110 of the first N region 101 and the second N region 103.

Figure 7:
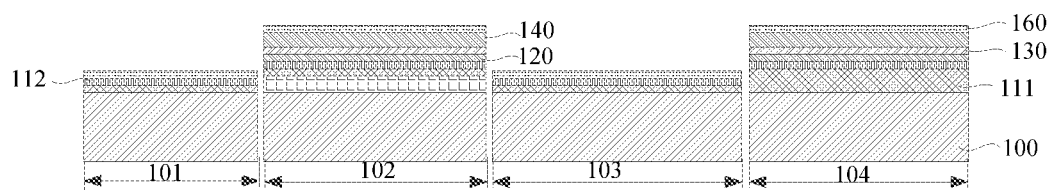
FIG. 7 is a sixth cross-sectional structural view showing a formation process of a semiconductor structure provided in an embodiment of this disclosure.
Figure 8:
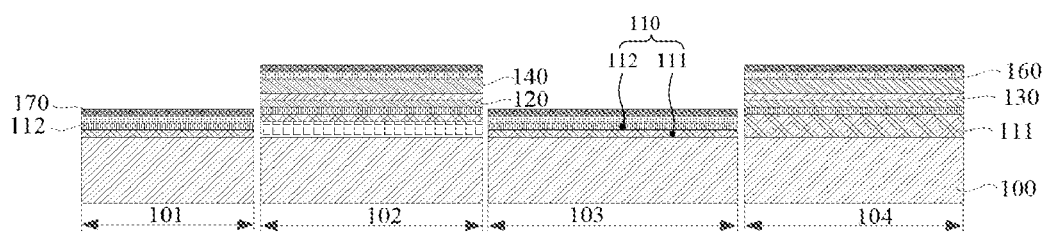
FIG. 8 is a seventh cross-sectional structural view showing a formation process of a semiconductor structure provided in an embodiment of this disclosure.

After the second etching process, as shown in FIGS. 7 and 8, the mask layer 150 of the first P region 102 and the second P region 104 is removed. The second work function layer 160 is formed on the gate dielectric layer 110 corresponding to the first N region 101 and the second N region 103 and on the second barrier layer 140 of the first P region 102 and the second P region 104.

The second work function layer 160 may be formed by the chemical vapor deposition process, physical vapor deposition process or atomic layer deposition process. As a part of the work function layer corresponding to the first N-type device and second N-type device, the second work function layer 160 is used to adjust the threshold voltages of the first N-type device and second N-type device.

It can be understood that if the materials of the second work function layer 160 and the first work function layer 130 are different, the threshold voltages of the first N-type device and the second N-type device are different from those of the first P-type device and the second P-type device respectively, so as to meet the requirements of different threshold voltages of N-type devices and P-type devices.

Exemplarily, the material of the second work function layer 160 includes a lanthanum oxide.

Furthermore, after forming the second work function layer 160 on the gate dielectric layer 110 corresponding to the first N region 101 and the second N region 103 and on the second barrier layer 140 of the first P region 102 and the second P region 104, the manufacturing method further includes forming a third barrier layer 170 on the second work function layer 160. The material of the third barrier layer 170 includes titanium nitride (TiN).

The embodiment of this disclosure also provides a semiconductor structure formed by the manufacturing method of the semiconductor structure in the above embodiment. As shown in FIG. 8, the semiconductor structure includes a substrate 100 and a gate dielectric layer 110 on the substrate 100. The substrate 100 includes a first N region 101 of a first N-type device, a first P region 102 of a first P-type device, a second N region 103 of a second N-type device and a second P region 104 of a second P-type device, the first P region 102 is adjacent to the first N region 101 and the second N region 103, and the second N region 103 is adjacent to the first P region 102 and the second P region 104. A first barrier layer 120, a first work function layer 130 and a second barrier layer 140 are sequentially stacked on the gate dielectric layer 110 of the first P region 102 and the second P region 104.

The structure and principle of the semiconductor structure provided by the embodiment of this disclosure are the same as those of the semiconductor structure formed by the manufacturing method provided in the above embodiment. Moreover, the beneficial effects of the semiconductor structure provided by the embodiment of this disclosure are the same as those of the manufacturing method of the semiconductor structure provided by the above embodiment, which will not be repeated here.

In this specification, embodiments or implementation modes are described in a progressive manner, and each embodiment focuses on the differences from other embodiments, so the same and similar parts between the embodiments may be referred to each other.

In the description of this specification, the description referring to the terms "one embodiment", "some embodiments", "exemplary embodiment", "example", "specific example" or "some examples" means that the specific features, structures, materials or characteristics described in combination with the embodiments or examples are included in at least one embodiment or example of this disclosure. In the specification, the illustrative use of the above terms do not necessarily refer to the same embodiment or example. Furthermore, the specific features, structures, materials or characteristics described may be combined in any one or more embodiments or examples in a proper manner.

Finally, it should be noted that the above embodiments are only used to illustrate the technical solution of this disclosure, but are not limitative of the present disclosure. Although the disclosure has been described in detail with reference to the foregoing embodiments, ordinary persons skilled in the art should understand that it is still possible to modify the technical solutions described in the foregoing embodiments or to replace some or all of their technical features equivalently. However, these modifications or replacements do not make the essence of corresponding technical solutions depart from the scope of the technical solutions of the embodiments of this disclosure.

What is claimed is:

1. A manufacturing method of a semiconductor structure, comprising:
   providing a substrate, wherein the substrate comprises a first N-type region of a first N-type device, a first P-type region of a first P-type device, a second N-type region of a second N-type device and a second P-type region of a second P-type device, wherein the first P-type region is adjacent to the first N-type region and the second N-type region, and the second N-type region is adjacent to the first P-type region and the second P-type region;
   forming a strain layer on the substrate of the first P-type region;
   forming an interface layer on the substrate of the first N-type region, the second N-type region, the second P-type region and on the strain layer of the first P-type region, forming a high-K gate dielectric layer on the interface layer, wherein the interface layer and the high-K gate dielectric layer together form a fate dielectric layer, and wherein the high-K gate dielectric layer has a dielectric constraint greater than that of $SiO_2$, forming a first barrier layer on the gate dielectric layer, a first work function layer on the first barrier layer and a second barrier layer on the first work function layer on the substrate in sequence;

forming a mask layer on the second barrier layer of the first P-type region and the second P-type region;

removing the second barrier layer of the first N-type region and the second N-type region by a first etching process with the mask layer as a mask, so as to expose the first work function layer of the first N-type region and the second N-type region; and removing the first work function layer and the first barrier layer of the first N-type region and the second N-type region by a second etching process, so as to expose the gate dielectric layer of the first N-type region and the second N-type region;

wherein a thickness of the interface layer of the second N-type region is greater than that of the interface layer of the first N-type region, and a thickness of the interface layer of the second P-type region is greater than that of the interface layer of the first P-type region.

2. The manufacturing method according to claim 1, wherein the first etching process comprises a dry etching process, and the second etching process comprises a wet etching process.

3. The manufacturing method according to claim 2, wherein an etching rate of an etching gas for the dry etching process to the second barrier layer is greater than that of the etching gas to the first work function layer.

4. The manufacturing method according to claim 3, wherein the etching rate of the etching gas to the first work function layer is equal to 0.

5. The manufacturing method according to claim 4, wherein a material of the second barrier layer comprises titanium nitride, a material of the first work function layer comprises aluminum oxide, and the etching gas comprises chlorine.

6. The manufacturing method according to claim 3, wherein a flow rate of the etching gas is 25-50 sccm.

7. The manufacturing method according to claim 6, wherein process parameters of the wet etching process comprise an etching temperature of 32° C.-58° C. and an etching time of 65 s-185 s.

8. The manufacturing method according to claim 2, wherein an etching solution for the wet etching process comprises a SC1 solution, and a volume fraction ratio of aqua ammonia, hydrogen peroxide and water in the SC1 solution is 1:1.5:10-1:3:100.

9. The manufacturing method according to claim 1, wherein forming the mask layer on the second barrier layer of the first P-type region and the second P-type region comprises:

forming an anti-reflection layer on the second barrier layer;

forming a photoresist layer on the anti-reflection layer, wherein the anti-reflection layer and the photoresist layer together form the mask layer; and removing the mask layer of the first N-type region and the second N-type region, and retaining the mask layer of the first P-type region and the second P-type region.

10. The manufacturing method according to claim 1, wherein after removing the first work function layer and the first barrier layer of the first N-type region and the second N-type region region by the second etching process, so as to expose the gate dielectric layer of the first N-type region and the second N-type region, the manufacturing method further comprises:

removing the mask layer of the first P-type region and the second P-type region;

forming a second work function layer on the gate dielectric layer corresponding to the first N-type region and the second N-type region and on the second barrier layer of the first P-type region and the second P-type region.

11. The manufacturing method according to claim 10, wherein a material of the second work function layer is different from that of the first work function layer.

12. The manufacturing method according to claim 11, wherein the second work function layer is a lanthanum oxide layer.

13. The manufacturing method according to claim 10, wherein after forming the second work function layer on the gate dielectric layer corresponding to the first N-type region and the second N-type region and on the second barrier layer of the first P-type region and the second P-type region, the manufacturing method further comprises:

forming a third barrier layer on the second work function layer.

* * * * *